United States Patent [19]

Goldman

[11] Patent Number: 4,545,869
[45] Date of Patent: Oct. 8, 1985

[54] BATH AND PROCESS FOR HIGH SPEED ELECTROPLATING OF PALLADIUM

[75] Inventor: Irina Goldman, Brooklyn, N.Y.

[73] Assignee: OMI International Corporation, Warren, Mich.

[21] Appl. No.: 694,939

[22] Filed: Jan. 29, 1985

[51] Int. Cl.$^4$ ............................................... C25D 3/52
[52] U.S. Cl. ....................................................... 204/47
[58] Field of Search ................. 204/47, 44.6, 109, 123

[56] References Cited

U.S. PATENT DOCUMENTS 2,452,308 10/1948 Lambros ................................ 204/47
4,098,656 7/1978 Deuber .................................... 204/47

Primary Examiner—G. L. Kaplan
Attorney, Agent, or Firm—Richard P. Mueller

[57] ABSTRACT

A palladium electroplating bath capable of plating highly ductile palladium metal. The bath comprises a palladium amine complex salt as a source of the palladium metal, ammonium sulfate, an ammonium halide, an alkali metal pyrophosphate, a stress reducing agent, and a minor amount of cyanide ions. In general, the cyanide ions are furnished to the bath by the addition of alkali metal cyanide. The pH of the bath will range from about 7 to 9. Electrolytic deposition will be carried out at a temperature of from about 50 to 80 degrees C. at high current densities up to about 3000 ASF. The method of depositing ductile palladium foil on a variety of substrates is also described and claimed.

15 Claims, No Drawings

BATH AND PROCESS FOR HIGH SPEED ELECTROPLATING OF PALLADIUM

FIELD OF THE INVENTION

The present invention relates to electroplating baths and methods for the electrodeposition of ductile palladium metal having a distinct crystalline structure on substrates from baths formulated from a particular combination of components.

BACKGROUND OF THE INVENTION

A considerable body of patent literature exists over a period of many years relating to the electrodeposition of palladium metal. This prior art is represented by the following U.S. Patents:
U.S. Pat. No. 330,149—Pilet et al.
U.S. Pat. No. 1,921,941—Powell et al.
U.S. Pat. No. 1,993,623—Raper
U.S. Pat. No. 2,207,358—Powell et al.
U.S. Pat. No. 2,451,340—Jernstedt
U.S. Pat. No. 3,150,065—Fatzer
U.S. Pat. No. 3,206,382—Wilson
U.S. Pat. No. 3,458,409—Hayashi
U.S. Pat. No. 3,480,523—Tyrrell
U.S. Pat. No. 3,530,050—Ickenham et al.
U.S. Pat. No. 3,544,435—Angus et al.
U.S. Pat. No. 3,580,820—Yamamura et al.
U.S. Pat. No. 3,920,526—Caricchio
U.S. Pat. No. 3,933,602—Henzi et al.
U.S. Pat. No. 4,076,599—Caricchio, Jr. et al.
U.S. Pat. No. 4,092,225—Davis
U.S. Pat. No. 4,098,656—Deuber
U.S. Pat. No. 4,144,141—Schuster et al.
U.S. Pat. No. 4,297,177—Fletcher The problems usually encountered in the known palladium metal electroplating baths, including limited deposition rates and brittleness due to hydrogen embrittlement were set forth in several papers presented at The Second AES Symposium on Economic Use of And Substitution For Precious Metals in The Electronics Industry held on Oct. 5th and 6th, 1982 at Danvers, Mass. The papers were by J. A. Abys "A Unique Palladium Electrochemistry Characteristics and Film Properties" and by H. S. Trop and A. V. Siaweleski "Application of BTL Pd Technology to Barrel Plating."

It is apparent therefore that there is a need for commercial palladium metal baths which will efficiently operate at high speeds over a wide range of current densities to produce a ductile palladium deposit on a variety of substrates.

OBJECTS OF THE INVENTION

One object of this invention is to provide means for overcoming the problems associated with using the prior palladium metal electroplating baths.

Another object of this invention is to provide electroplating baths with the right combination of components to permit the efficient deposition of palladium metal on various substrates.

A further object of this invention is to provide palladium amine complex-containing electroplating baths wherein deposition of highly ductile palladium metal is readily achieved.

These and other objects of the present invention will become more readily apparent from the following description of the specific features thereof.

SUMMARY OF THE INVENTION

In accordance with the present invention it has now been found that the efficient high speed deposition of ductile palladium metal having a distinct crystalline structure indicative of high ductility, can be achieved by utilizing as a source of the palladium bath, a palladium amine in combination with at least four other bath components and minor amounts of cyanide ions. These other bath components include ammonium sulfate, ammonium halide salt, an alkali metal pyrophosphate, and a stress reducing agent. The cyanide ions may be added to the bath in the form of salts, e.g., alkali metal cyanide. The electroplating baths of this invention will generally be operated under slight basic conditions, preferably at a pH of from about 7 to 9. The temperature of the bath will range from about 50 to 80 degrees C., while current densities as high as 3000 ASF may be effectively utilized in the practice of the present invention. The electroplating bath may also contain a surfactant, preferably an alkali metal fluorochemical sulfonate, to minimize or avoid any pitting problems.

DETAILED DESCRIPTION OF THE INVENTION

As set forth above, one of the principal ingredients of the electroplating baths is the palladium amine complex which can be the halide, nitrite, nitrate, sulphate, or sulphamate.

Illustrative complexes include the following:
Palladous diamine chloride—$Pd(NH_3)_2Cl_2$
Palladous diamine dinitrite—$Pd(NH_3)_2(NO_2)_2$
Palladous tetramine nitrate—$Pd(NH_3)_4(NO_3)_2$
Palladous diamine sulfate—$Pd(NH_3)_2SO_4$ The above chloride and dinitrite complexes are preferred for the present purposes.

Other palladium salts which may be utilized are dichlorodiamine palladium and the like.

The palladium metal in the bath is used in amounts ranging from about 10 to 80 g/l, and preferably about 40 to 70 g/l.

The other four essential electroplating bath components are ammonium sulfate, ammonium halide, an alkali metal pyrophosphate, and a stress reducing agent. Although the amounts of these components used in the baths may vary over a wide range, the presence of each of these components is essential in order to attain the desired results. It will be understood that these three components are known conducting salts or electrolytes.

Ammonium sulfate will be used in amounts ranging from about 20 to 90 g/l, and preferably from about 30 to 50 g/l.

The ammonium halide may be ammonium chloride, ammonium bromide, or ammonium fluoride. However, the use of ammonium chloride is especially preferred. Amounts of the ammonium halide in the bath may vary from about 10 to 80 g/l, and preferably from about 20 to 30 g/l.

Tetrapotassium pyrophosphate is the preferred alkali metal pyrophosphate which can be employed in formulating the electroplating baths of this invention. Nevertheless other tetra alkali metal pyrophosphates such as tetrasoium pyrophosphate, ammonium pyrophosphate, and the like may be utilized. The tetra alkali metal pyrophosphate is used in amounts ranging from about 20 to 150 g/l, and preferably from about 80 to 100 g/l, expressed as the trihydrated salt. The use of electroplating baths containing palladous diamine dinitrite and tetrapotassium pyrophosphate is described in the U.S. Pat. No. 4,092,225 to Davis, but it has a current density limitation of about 50 ASF.

Another component of the palladium electroplating baths of this invention is a stress reducing agent. Preferably, the stress reducing agent is a derivative benzene sulphonic acid; and the use of o-formyl benzene sulphonic (OFB) was found to be particularly useful in many operations. Other stress reducing agents which may be employed in the present invention include, for example, saccharin, and 2-butene-1,4-dione. In general, the amount of stress reducing agent usually employed will range from about 0.1 to 10 g/l, and preferably from about 3 to 5 g/l.

In achieving palladium depositions having high ductility, i.e. palladium foil that can be rolled in a cylinder or deformed to a square without cracking, it has been discovered that the bath should contain from 0.5 to 100 ppm, preferably 1 to 20 ppm of cyanide ions. The cyanide can be supplied to the bath in the form of an alkali metal cyanide salt such as potassium or sodium cyanide. It will be understood, however, that the form in which the cyanide ions are added to the bath is not critical and various salts, for example, can be utilized.

The resulting deposited palladium lattice is characterized by a very well defined, highly crystalline, angular structure that corresponds to deposits of outstanding ductility. FC-95 and FC-98 are potassium perfluoroalkyl sulfonates, and their use is generally preferred. Both FC-95 and FC-98 decompose at 390 degrees C. In a 0.1% aqueous solution FC-95 has a pH of 7-8, while FC-98 has a pH of 6-8. FC-98, which is potassium perfluorocyclohexyl sulfonate, is slightly less surface active and is capable of producing foam that is less dense and less stable. Both types have outstanding chemical and thermal stability, especially in acidic and oxidizing systems. The method of preparing these perfluoroalkyl sulfonates is disclosed in U.S. Pat. No. 2,519,983 to Simons; while a prior art use of such surfactants in electroplating is illustrated by U.S. Pat. No. 2,750,334 to Brown. The teachings of these patents are incorporated herein by reference.

The pH of the electroplating baths will be from about 7 to 9, preferably from about 7 to 8; and the baths will be operated at temperatures of from about 30 to 80 degrees C., preferably from about 50 to 80 degrees C. Although the tank current densities which can be effectively utilized with the baths of this invention may range from about 0.05 to 200 ASF, somewhat higher current densities are preferred, i.e. from about 180 up to about 200 ASF. However, in contrast, a current density range of from about 200–3,000 ASF can be attained by the practice of the present invention in high speed plating systems. Under the preferred operating conditions of the present invention the rate of ductile palladium metal deposition on the substrate may be as high as 6 microns per minute, with ranges of from about 1 to 25 being readily attained.

The baths of this invention can be used in conjunction with insoluble platinum, platinum clad, tantalum, or columbium anodes. In general, rack plating is employed and workpieces, e.g. box and pin contacts, printed circuit board contacts, decorative jewelry, etc. have surface of metals such as copper, brass, bronze, nickel, silver, steel, etc. The palladium metal, or when desired, palladium metal alloy ductile deposits are of high quality.

Electroplating baths providing extremely ductile palladium according to the present invention were formulated with the following two compositions:

EXAMPLE I

| Component | Concentration, g/l |
|---|---|
| Palladium as $Pd(NH_3)_2Cl_2$ | 60 g/l |
| $(NH_4)_2SO_4$ | 50 g/l |
| $NH_4Cl$ | 30 g/l |
| $K_4P_2O_7 \times 3H_2O$ | 100 g/l |
| OFB | 5 g/l |
| CN as KCN | 2 PPM |
| T(c) | 60° |
| Current Density | 200 ASF |

The palladium was deposited on nickel plated copper and brass substrates. A highly ductile palladium deposit with very crystalline, angular structures was obtained.

EXAMPLE 2

| Component | Concentration, g/l |
|---|---|
| Palladium as $Pd(NH_3)_2Cl_2$ | 60 g/l |
| $(NH_4)_2SO_4$ | 50 g/l |
| $NH_4Cl$ | 30 g/l |
| $K_4P_2O_7 \times 3H_2O$ | 100 g/l |
| OFB | 5 g/l |
| CN as KCN | 10 PPM |
| T(C) | 50° |
| Current Density, ASF | 100 |

Although a somewhat lower plating temperature and current density were employed as compared with the conditions of Example I, the same highly ductile palladium deposit having the characteristic, angular structure resulted.

It will be further understood that the examples set forth above are illustrative only, and that the invention is subject to variations and modifications without departing from the broader concepts and features.

What is claimed is:

1. An improved bath for electroplating highly ductile palladium metal, said bath comprising from about 10 to 80 g/l of palladium metal in the form of a palladium amine complex; about 20 to 90 g/l of ammonium sulfate; about 10 to 80 g/l of ammonium halide; from about 20 to 150 g/l of an alkali metal pyrophosphate; a stress reducing agent; and a minor amount of cyanide ions.

2. The bath of claim 1 which contains about 1 to 20 ppm of cyanide ions.

3. The bath of claim 1 wherein the cyanide ions are in the form of an alkali metal cyanide.

4. The bath of claim 1 wherein said ammonium halide is ammonium chloride.

5. The bath of claim 1 wherein the palladium amine complex is palladium diamine chloride.

6. The bath of claim 1 wherein the stress reducing agent is a derivative of benzene sulphonic acid.

7. The high speed bath of claim 6 wherein the benzene sulphonic acid derivative is o-formyl benzene sulphonic acid.

8. A method for electrodepositing highly ductile palladium on a metallic substrate which comprises immersing said substrate in an electroplating bath operated at a pH within the range of from about 7 to 9, a temperature of from about 30 to 80 degrees C., and a current density of from about 0.05 to 3000 ASF; said electroplating bath comprising an aqueous solution having the following components:

| Components | Concentration, g/l |
| --- | --- |
| (a) palladium metal, as palladousamine complex | 10 to 80 |
| (b) $(NH_4)_2SO_4$ | 20 to 80 |
| (c) $NH_4Cl$ | 10 to 80 |
| (d) alkali metal pyrophosphate | 20 to 150 |
| (e) stress reducing agent and | 0.1 to 10 |
| (f) CN, as alkali metal cyanide | 1 to 20 ppm. |

9. The method of claim 8 wherein the temperature of the bath is from about 50° to 80° C.

10. The method of claim 8 wherein the current density is from 100 to 3000 ASF.

11. The method of claim 8 wherein the substrate is selected from the group consisting of copper, nickel, iron, gold, and alloys thereof.

12. The method of claim 8 wherein the palladousamine complex is palladous amine chloride.

13. The method of claim 8 wherein the palladiumamine complex is palladous amine nitrite.

14. The method of claim 8 wherein the stress reducing agent is a derivative of benzene sulphonic acid.

15. The method of claim 14 wherein the benzene sulphonic acid derivative is o-formyl-benzene sulphonic acid.

* * * * *